(12) United States Patent
Orlowski et al.

(10) Patent No.: US 7,811,891 B2
(45) Date of Patent: Oct. 12, 2010

(54) METHOD TO CONTROL THE GATE SIDEWALL PROFILE BY GRADED MATERIAL COMPOSITION

(75) Inventors: Marius K. Orlowski, Austin, TX (US); Olubunmi O. Adetutu, Austin, TX (US); Phillip J. Stout, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1093 days.

(21) Appl. No.: 11/331,958

(22) Filed: Jan. 13, 2006

(65) Prior Publication Data

US 2007/0166902 A1   Jul. 19, 2007

(51) Int. Cl.
*H01L 21/336* (2006.01)
(52) U.S. Cl. .............. 438/285; 438/590; 438/718; 257/E21.198; 257/E21.201
(58) Field of Classification Search .......... 438/285, 438/718, 590–592; 257/E21.623, E21.624, 257/E21.201, E21.198
See application file for complete search history.

(56) References Cited

U.S. PATENT DOCUMENTS

| | | | |
|---|---|---|---|
| 5,834,817 A | 11/1998 | Satoh et al. | 257/387 |
| 6,518,106 B2 * | 2/2003 | Ngai et al. | 438/157 |
| 6,589,827 B2 * | 7/2003 | Kubo et al. | 438/157 |
| 6,624,483 B2 | 9/2003 | Kurata | 257/387 |
| 6,645,640 B1 | 11/2003 | Kuriu | 428/474.4 |
| 6,646,326 B1 | 11/2003 | Kim et al. | 257/623 |
| 6,713,356 B1 | 3/2004 | Skotnicki et al. | 438/285 |
| 2003/0201505 A1 | 10/2003 | Kurata | 257/412 |
| 2003/0227055 A1 * | 12/2003 | Bae et al. | 257/346 |
| 2004/0119110 A1 * | 6/2004 | Park | 257/315 |
| 2004/0238895 A1 * | 12/2004 | Mutou | 257/368 |
| 2006/0060920 A1 * | 3/2006 | Paranjpe et al. | 257/347 |

FOREIGN PATENT DOCUMENTS

WO   WO 00/34984   6/2000

OTHER PUBLICATIONS

T. Ghani et al., "100 nm Gate Length High Performance/Low Power CMOS Transistor Structure," 1999, IEEE, IEDM 99, pp. 415-418.
S. Nakai et al., "A 100 nm CMOS Technology with 'Sidewall-Notched' 40 nm Transistors and SiC-Capped Cu/VLK Interconnects for High Performance Microprocessor Applications," 2002 Symposium on VLSI Technology Digest of Technical Papers, IEEE, pp. 66-67.
T. Skotnicki et al., "Well-Controlled, Selectively Under-Etched Si/SiGe Gates for RF and High Performance CMOS," 2002 Symposium on VLSI Technology Digest of Technical Papers, IEEE, pp. 156-157.

* cited by examiner

*Primary Examiner*—W. David Coleman
*Assistant Examiner*—Shaka Scarlett
(74) *Attorney, Agent, or Firm*—Hamilton & Terrile, LLP; Michael Rocco Cannatti

(57) ABSTRACT

A semiconductor process and apparatus uses a predetermined sequence of patterning and etching steps to etch a gate stack (30, 32) formed over a substrate (36), thereby forming an etched gate (33) having a vertical sidewall profile (35). By constructing the gate stack (30, 32) with a graded material composition of silicon-based layers, the composition of which is selected to counteract the etching tendencies of the predetermined sequence of patterning and etching steps, a more idealized vertical gate sidewall profile (35) may be obtained.

12 Claims, 3 Drawing Sheets

METHOD TO CONTROL THE GATE SIDEWALL PROFILE BY GRADED MATERIAL COMPOSITION

BACKGROUND OF THE INVENTION

1. Field of the Invention

The present invention is directed in general to the field of semiconductor devices. In one aspect, the present invention relates to controlling the profile of semiconductor features in semiconductor devices.

2. Description of the Related Art

As semiconductor device sizes are scaled down, the requirements for device design and fabrication continue to be tightened in order to fit more circuitry on smaller chips. As device sizes shrink, increasingly complex etch processes are used to define semiconductor devices features, such as polysilicon gates. For example, a typical gate patterning process may use several steps after the photoresist ("PR") is patterned, including a hard mask etch step (which uses the PR as a mask), an ARC etch step (which uses the hard mask as a mask), a preliminary cleaning step (which includes some etching action), a break through etch step (to remove oxide), a main poly etch step (which can leave some poly on dielectric outside gate), a soft landing etch step, an overetch step (to clean all polysilicon) and a sidewall clean etch step (which etches sidewalls and potentially gouges the silicon substrate). TEOS (tetra-ethoxy-silane) or silicon nitride may be used as a hard mask. Silicon nitride or amorphous carbon may be used as the ARC layer. Each type of processing may contribute separately to the etching of the polysilicon gate, making it difficult to control the vertical profiles of polysilicon gates. These etch and clean steps—in conjunction with doping, nitrogen implant (for PMOS gates) and implant damage—result in an irregular gate profile that, in many cases, deviates substantially from the ideal vertical sidewall line. For example, the gate can have an "hourglass" shape, a "coke-bottle" shape, or can display a "foot" or notches (aka "mouse bites") at the bottom and in some cases at the top of the gate. This is shown in FIG. 1 which illustrates examples of various device feature profiles 2-6 formed over a first layer 8 and substrate 7, including an idealized gate profile 2, an hourglass gate profile 3, a gate profile 4 having notches on the top, a gate profile 5 having foot extensions on the bottom, and a gate profile 6 having notches on the bottom.

Smaller device geometries also change the design considerations used in manufacturing semiconductor devices. For example, conventional transistor fabrication processes (such as described in Ghani et al., "100 nm Gate Length High Performance/Low Power CMOS Transistor Structure," IEDM, p. 415 (1999)) will deliberately create a notch at the base of a gate electrode for purposes of reducing total capacitance, minimizing gate length and lowering parasitic resistance. The use of notches in the gates has a number of drawbacks, including increasing material costs and reducing chip packing density as compared to a gate electrode of the same size having a vertical sidewall profile.

Accordingly, a need exists for a semiconductor manufacturing process which provides better control of the gate sidewall profile. In addition, there is a need for a fabrication process which forms a gate without including notches or mouse bites in the gate sidewall. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
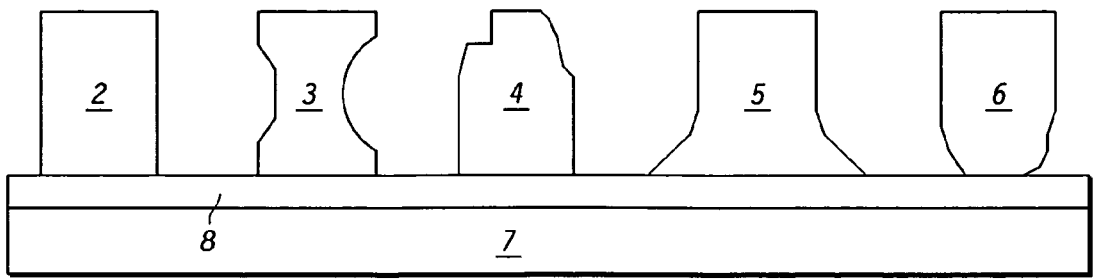
FIG. 1 is a cross-sectional illustration of various polysilicon gate profiles that are caused by different gate patterning processes.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating a silicon-based device feature, such as a gate, by forming the device feature with a graded composition of materials having differing etch rates for a given pattern and etch sequence so that, when etched, a predetermined or vertical device feature profile is obtained. With this approach, a gate having a graded composition may be formed from constituent materials having different etch rates (and optionally different thicknesses) which are selected by taking into account the sequence of processing steps used to pattern and etch the gate. In an illustrative embodiment, a graded composition gate electrode of thickness $z_o$ is formed having the composition $Si_{1-a-b-c} A_a B_b C_c$, where one or more species A, B, C included are present in an amount a, b, c that varies with the vertical coordinate z of the gate electrode. In one embodiment, the species content a, b, c is a function of the thickness z. In another embodiment, the gate is formed as a composite or laminate of layers, each having a different etch rate (and optionally, thickness) so that, for example, a first layer of slower etching silicon (Si) is formed under a second layer of faster etching silicon germanium (SiGe). Whether forming a graded composition of materials or a laminate of material layers, any desired deposition technique may be used to form the materials, such as chemical vapor deposition (CVD), plasma-enhanced chemical vapor deposition (PECVD), physical vapor deposition (PVD), atomic layer deposition (ALD) or combinations of the above. In general, such a composition may be dialed in at a particular depth to influence the local etch rate relative to another depth, thus correcting the profile deviation from the straight line.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 2:
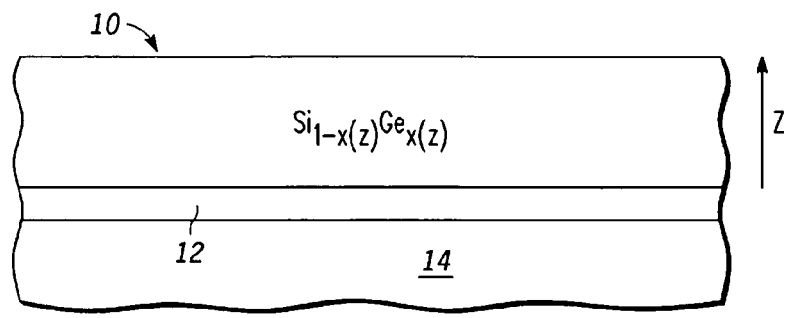
FIG. 2 is a partial cross-sectional view of a semiconductor structure including a substrate, a gate dielectric layer and an unetched gate stack formed as a graded material composition of silicon-based layers having depth-dependent etch rates.

Turning now to FIG. 2, a partial cross-sectional view is depicted of a semiconductor structure including a substrate 14, a gate dielectric layer 12 and an unetched gate stack 10 formed as a graded material composition of silicon-based layers having depth-dependent etch rates. In the depicted example, the gate stack 10 is formed as a graded composition of silicon-based material in which an additional species (e.g., Ge) is used to provide depth-dependent etch rate differentials. The gate stack composition may be described with the equation $Si_{1-x}Ge_x$ (where content x of Ge relative to Si is a function of gate stack vertical dimension z), resulting in a composition of layered or graded materials. The composition may be graded as a simple linear depth function so that the silicon content decreases (or increases) linearly from a first concentration to a second concentration as a function of the gate stack thickness, while the germanium content increases (or decreases) linearly from a first concentration to a second concentration as a function of the gate stack thickness. However, it will be appreciated that other more complex depth-dependent composition functions may be used, including arbitrarily determined composition functions that take into account the sequence of processing steps used to pattern and etch the gate.

By structuring the composition of the gate stack 10 with low etch rate materials in positions where the existing gate pattern and etch processes have excessive lateral etching, deviations from the ideal vertical sidewall can be counteracted. In addition or in the alternative, deviations from the ideal vertical sidewall can also be counteracted by structuring the composition of the gate stack 10 with high etch rate materials in positions where the existing gate pattern and etch processes have inadequate lateral etching. For example, if SiGe etches much faster than Si in a given plasma etch process (e.g., F and HBr plasmas, where the etch ratio is 100:1 for $Si_{1-x}Ge_x$, where x=0.40), and if the given plasma etch process when applied to a conventional polysilicon gate stack produces a gate profile having a foot at the base of the gate, then by constructing the gate stack with a lower SiGe layer and an upper Si layer, the foot is removed or reduced from the gate profile. As will be appreciated, other plasma etch processes can etch Si selectively to SiGe, in which case the gate stack structure may be adjusted accordingly, taking into account the profile results of said plasma etch processes on a conventional polysilicon gate.

In a selected alternative embodiment, the gate stack composition may be structured to counteract the lateral etching effects of dopants (B versus As or P) in the gate stack where such dopants influence the local etch rate. For example, with one type of transistor device (e.g., NMOS gates), material (e.g., $Si_{1-x-y}Ge_xC_y$) is included or deposited in the gate stack 10 to compensate for doping-related etch/clean effects, while another material (e.g., $Si_{1-v-w}Ge_vC_w$, where the Ge contents x and v and the Carbon contents y and w may be different) may be included or deposited in the gate stack 10 for other transistor device types (e.g., PMOS gates) to compensate for doping-related etch/clean effects.

While the depth dependent lateral etching differences in the patterning, etching and cleaning steps can create arbitrarily-shaped sidewall profiles (including but not limited to an hour glass profile, sidewall notches and sidewall feet), the present invention may be used to counteract and control these profiles so that they are more straight vertical lines. FIGS. 3-9 illustrate how specific profile defects are overcome, but it will be appreciated that any profile defect may be addressed in accordance with selected embodiments of the present invention.

Figure 3:
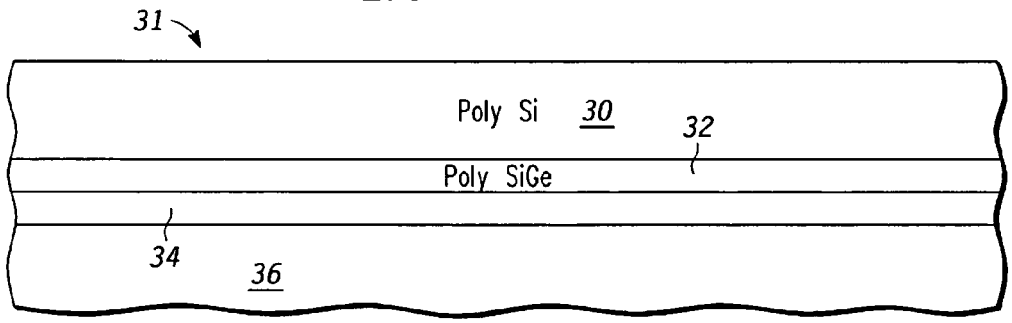
FIG. 3 is a partial cross-sectional view of a semiconductor structure on which is formed an unetched gate stack formed from a first polycrystalline SiGe layer and a second polycrystalline Si layer.

FIG. 3 is a partial cross-sectional view of a semiconductor structure 31 after formation of an unetched gate stack 30, 32 and a dielectric or insulator layer 34 over a substrate 36. Depending on the type of transistor device being fabricated, the substrate 36 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 36 may be implemented as the top silicon layer of a silicon-on-insulator (SOI) structure. Prior to forming the unetched gate stack 30, 32, an insulator or dielectric layer 34 is formed by depositing or growing an insulator or high-k dielectric (e.g., silicon dioxide, oxynitride, metal-oxide, nitride, etc.) over the semiconductor substrate 36 using chemical vapor deposition (CVD), plasma-enhanced chemical vapor deposition (PECVD), physical vapor deposition (PVD), atomic layer deposition (ALD), thermal oxidation, or any combination(s) of the above.

As depicted, the unetched gate stack is formed as a first combination consisting of a bottom layer 32 of silicon and germanium alloy (SiGe) and a top layer 30 of polycrystalline silicon. The bottom polysilicon SiGe layer 32 and top Si layer 30 may each be blanket deposited over the dielectric layer 34 by CVD, PECVD, PVD, ALD, or any combination(s) thereof, and may optionally include one or more conductive layers (e.g., metal, silicide or the like). Alternatively, the unetched gate stack may be formed by depositing the bottom SiGe layer 32 and then forming the top silicon layer 30 using CVD deposition. The stack 30, 32 formed in this way covers the entire top surface of the silicon substrate 36.

Figure 4:
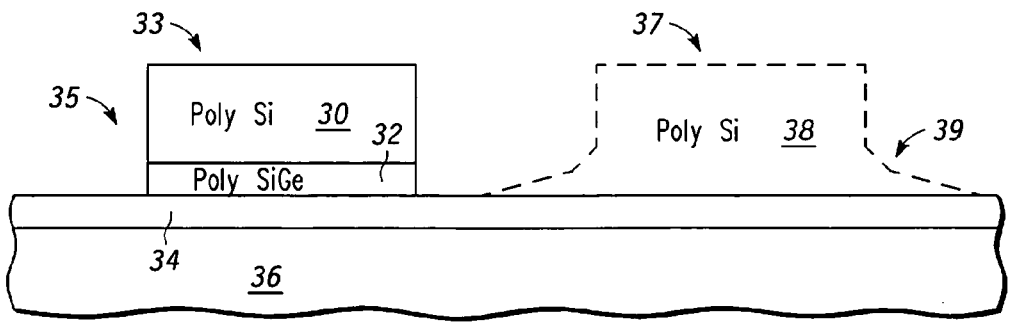
FIG. 4 illustrates processing subsequent to FIG. 3 after the gate stack is etched.

FIG. 4 illustrates processing of the semiconductor structure subsequent to FIG. 3 after the gate stack 30, 32 is etched to form an etched gate stack structure 33 which defines a channel region in the substrate 36. Any desired gate patterning and etch sequence may be used to form the etched gate stack structure 33, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. If such an etch sequence were applied to a conventional polysilicon gate layer, the resulting gate structure 37 (indicated in dashed lines) could result in an irregular sidewall profile, such as the sidewall profile 39 which includes foot extensions at the base of the gate structure 37. However, these profile irregularities may be reduced or eliminated by forming the etched gate stack structure 33 with a first or bottom SiGe layer 32 formed over the gate dielectric 34, and a second or top polycrystalline Si layer 30 formed over the first polysilicon SiGe layer 32. In particular, when the main poly plasma etch step uses a plasma process (e.g., F and HBr plasmas) in which SiGe etches faster than Si, the foot extensions at the base of the gate are removed or substantially reduced. Though the figures illustrate a simplified representation of the gate stack layers 30, 32, it will be appreciated that the germanium content x in the bottom SiGe layer 32 can be graded to achieve a perfect match, or to at least obtain a substantially vertical sidewall profile 35. As will be appreciated, the SiGe layer 32 and Si layer 30 can be swapped if the plasma etch and/or clean steps being used have a silicon etch rate that is larger than the SiGe etch rate.

Figure 5:
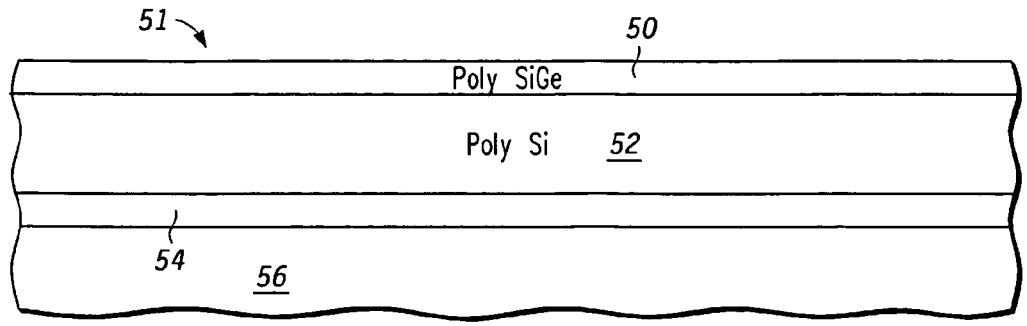
FIG. 5 is a partial cross-sectional view of a semiconductor structure on which is formed an unetched gate stack formed from a first polycrystalline Si layer and a second polycrystalline SiGe layer.

To illustrate another example implementation, FIG. 5 shows a partial cross-sectional view of a semiconductor structure 51 after formation of an unetched gate stack 50, 52 and a dielectric or insulator layer 54 over a substrate 56. As described above, any desired implementation and fabrication process may be used to form the substrate 56 and the insulator or dielectric layer 54. However, in this example, the unetched gate stack is formed as a first combination consisting of a bottom layer 52 of polycrystalline silicon and a top layer 50 of SiGe. The bottom polysilicon layer 52 and top SiGe layer 50 may each be formed in any desired way, including using deposition and/or epitaxial growth techniques, and may optionally include one or more conductive layers (e.g., metal, silicide or the like).

Figure 6:
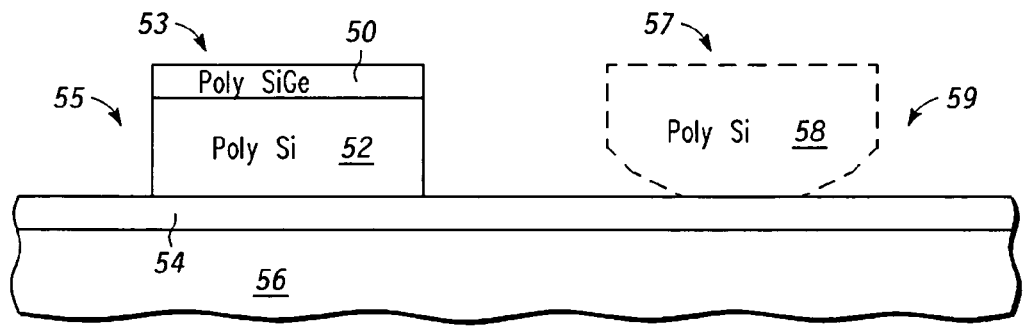
FIG. 6 illustrates processing subsequent to FIG. 5 after the gate stack is etched.

FIG. 6 illustrates processing of the semiconductor structure subsequent to FIG. 5 after the gate stack 50, 52 is etched to form an etched gate stack structure 53 which defines a channel region in the substrate 56. If a particular sequence of gate patterning and etching steps used to form the etched gate electrode 53 were applied to a conventional polysilicon gate layer, the resulting gate structure 57 (indicated in dashed lines) could have an irregular sidewall profile, such as the sidewall profile 59 which includes notches at the base of the gate structure 57. However, these profile irregularities may be reduced or eliminated by forming the etched gate stack structure 53 with a first or bottom Si layer 52 formed over the gate dielectric 54, and a second or top polycrystalline SiGe layer 50 formed over the first polysilicon Si layer 52. As a result, if the main poly plasma etch step uses a plasma process (e.g., F and HBr plasmas) in which SiGe etches faster than Si, the notches at the base of the gate are removed or substantially reduced as a result of the top SiGe layer 50 being etched more quickly than the lower Si layer 52. Though the figures illustrate a simplified representation of the gate stack layers 50, 52, it will be appreciated that the germanium content x in the top SiGe layer 52 can be graded to achieve a perfect match, or to at least obtain a substantially vertical sidewall profile 55. As will be appreciated, the Si layer 52 and SiGe layer 50 can be swapped if the plasma etch and/or clean steps being used have a silicon etch rate that is larger than the SiGe etch rate.

Figure 7:
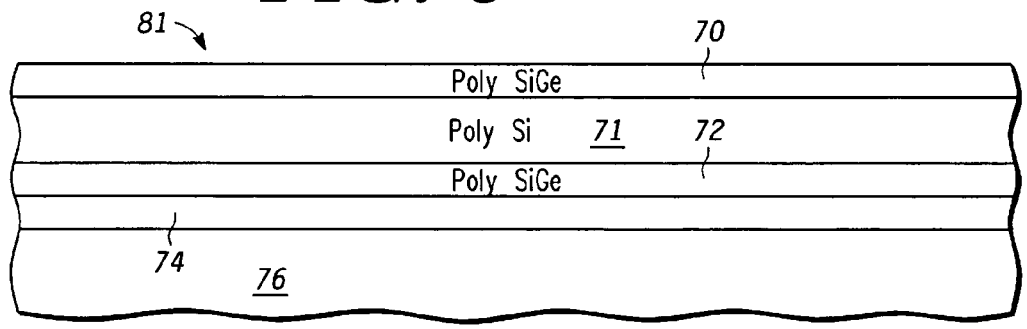
FIG. 7 is a partial cross-sectional view of a semiconductor structure on which is formed an unetched gate stack formed from a first polycrystalline SiGe layer, a second polycrystalline Si layer and a third polycrystalline SiGe layer.

To illustrate yet another example implementation, FIG. 7 shows a partial cross-sectional view of a semiconductor structure 81 after formation of an unetched gate stack 70, 71, 72 and a dielectric or insulator layer 74 over a substrate 76. As described above, any desired implementation and fabrication process may be used to form the substrate 76 and the insulator or dielectric layer 74. However, in this example, the unetched gate stack is formed as a first combination consisting of a bottom layer 72 of SiGe, a middle layer 71 of polycrystalline silicon and a top layer 70 of SiGe. The bottom SiGe layer 72, middle Si layer 71 and top SiGe layer 50 may each be formed in any desired way, including using deposition and/or CVD deposition techniques, and may optionally include one or more conductive layers (e.g., metal, silicide or the like).

Figure 8:
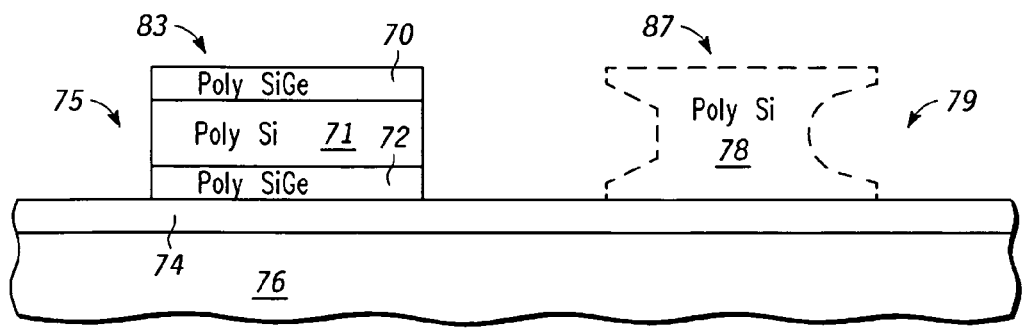
FIG. 8 illustrates processing subsequent to FIG. 7 after the gate stack is etched.

FIG. 8 illustrates processing of the semiconductor structure subsequent to FIG. 7 after the gate stack 70, 71, 72 is etched to form an etched gate stack structure 83 which defines a channel region in the substrate 76. If a particular sequence of gate patterning and etching steps used to form the etched gate electrode 83 were applied to a conventional polysilicon gate layer, the resulting gate structure 87 (indicated in dashed lines) could have an irregular sidewall profile, such as the hour glass shaped sidewall profile 79. However, these profile irregularities may be reduced or eliminated by forming the etched gate stack structure 83 with a first or bottom SiGe layer 72 formed over the gate dielectric 74, a second or middle Si layer 71 formed over the first/bottom SiGe layer 72 and a third or top SiGe layer 70 formed over the second/middle Si layer 71. As a result, if the main poly plasma etch step uses a plasma process (e.g., F and HBr plasmas) in which SiGe etches faster than Si, the notches at the middle of the gate are removed or substantially reduced as a result of the SiGe layers 70, 72 being etched more quickly than the Si layer 71, thereby counteracting the hourglass shape and straightened out the sidewall profile 75 of the gate electrode 83. Though the figures illustrate a simplified representation of the gate stack layers 70, 71, 72, it will be appreciated that the germanium content x in the SiGe layers 70, 72 can be graded to achieve a perfect match, or to at least obtain a substantially vertical sidewall profile 75. As will be appreciated, the SiGe and Si layers can be swapped if the plasma etch and/or clean steps being used have a silicon etch rate that is larger than the SiGe etch rate.

Figure 9:
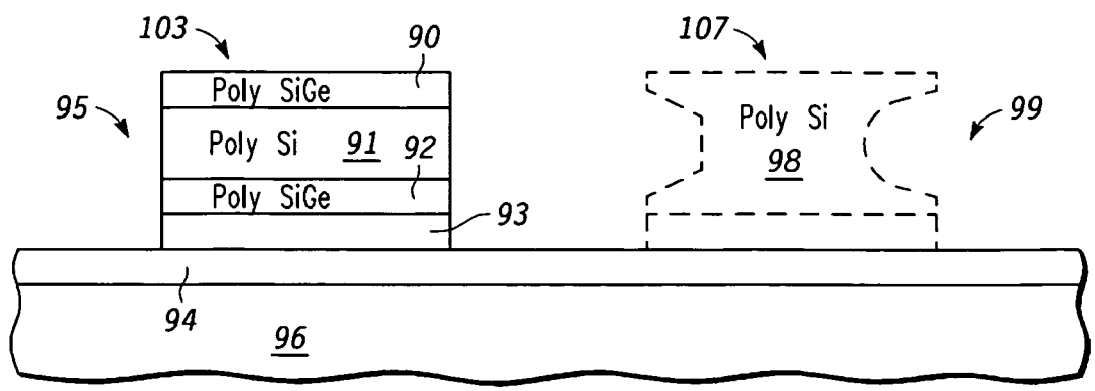
FIG. 9 is a partial cross-sectional view of a semiconductor structure on which is formed an etched gate stack formed from a first metal layer, a bottom polycrystalline SiGe layer, a middle polycrystalline Si layer and a upper polycrystalline SiGe layer.

Various embodiments of the present invention may advantageously be applied to newer device technologies, such as CMOS device technologies which use dual-metal gate conductors and high dielectric constant (high-k) gate dielectrics. Metal gates allow control of the threshold voltage of the device by virtue of the work function of the metal material and they obviate gate-depletion and boron-penetration effects and provide a significantly lower sheet resistance, while high-k gate dielectric materials enable the deposition of thicker gate dielectric layers without adversely affecting the physical and electrical thickness characteristics of the deposited dielectric layer (compared with thinner silicon dioxide dielectric layers). However, the use of high-k gate dielectric layers to make single and dual metal gate devices creates new design challenges, such as pinning the work function of the gate electrodes toward the middle of the silicon band gap and increased charge (electron and hole) scattering which leads to decreased mobility, particularly for PMOS devices, which has a negative impact on device parameters including threshold voltage and drive current. By including a metal layer in the gate, the work function can be adjusted for the device. The graded material composition of silicon-based layers of the present invention may be used with metal gate technologies by forming the graded composition gate electrode on top of a metal layer. This is illustrated in FIG. 9, which depicts an etched gate stack structure 103 which has been etched and formed over the insulator layer 94 and substrate 96. As indicated above, profile irregularities that would otherwise be caused by a particular sequence of gate patterning and etching steps (e.g., resulting in the hour glass profile 99 at gate 107 indicated in dashed lines) may be reduced or eliminated by first forming a metal gate layer 93 (e.g., 50-200 Å of TaC or TiN), and then forming the etched gate stack structure 103 as a SiGe/Si/SiGe stack 90, 91, 92 over the metal gate layer 93. With this structure, the application of the gate patterning and etching steps results in an etched gate structure 103 having a vertical profile or at least a substantially vertical sidewall profile 95.

In a various embodiments of the present invention, the composition of the graded composition gate may be defined as:

$$Si_{1-a-b-c} A_a B_b C_c,$$

where A may be a species suitable for forming an alloy with silicon (e.g, germanium or carbon), B may be an inert chemical species (e.g., nitrogen), C may be a dopant (such as arsenic, phosphorus, boron or another suitable component), and the content parameters a, b, c are a function of the gate electrode vertical coordinate z ($0<z<z_o$) This definition may be used to define a graded material composition of $Si_{1-x(z)}Ge_{x(z)}$ (with germanium being the A species and with the B and C species being zeroed out), but more complex material compositions are also possible, such as SiGeB or SiGeAs or SiGeN (here, the contents a, b, c have been suppressed). The resulting laminate layers or graded material composition can be readily achieved in CVD. In general, such a composition will be dialed in at particular depth z to influence the local etch rate relative to another depth, thus correcting the deviation from the straight line. Of course, if desired for some specific applications, one could introduce shape effects into the gate sidewall profile in a controlled way.

As will be appreciated, there are a variety of silicon-based device features that can be fabricated using the techniques described herein, including but not limited to gate electrodes for low voltage MOSFET transistors, floating gate devices, and other types of non-volatile memory (NVM) devices, such as nanocluster devices and SONOS (silicon-oxide-nitride-oxide-silicon) devices. The semiconductor structure as described includes a plurality of layers formed as a composite or laminate of stacked layers that can, by virtue of selecting the placement and type of layer on the basis of its relative etch rate, advantageously be etched to form a device feature having a vertical sidewall profile or at least a substantially vertical sidewall profile.

It will also be appreciated that additional processing steps will be used to complete the fabrication of the gate electrodes into functioning transistors or devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

In one form, there is provided herein a method for fabricating a semiconductor device by forming a first insulating layer over a semiconductor substrate, forming a gate stack structure over the first insulating layer and then selectively etching the gate stack structure using a predetermined sequence of patterning and etching steps to form an etched gate having vertical sidewalls. To this end, the gate stack structure is formed from a material $Si_{1-a-b-c} A_a B_b C_c$, where A may be a species suitable for forming an alloy with silicon, B may be an inert chemical species, C may be a dopant, and a, b, c are content parameters defined as a function of a thickness measure for the gate stack structure. A simplified example would be a gate stack structure formed from a graded composite material $Si_{1-x(z)}Ge_{x(x)}$, where x=x(z) is a function of a gate stack vertical dimension z. By forming the gate stack structure as a graded material composition of silicon-based layers (e.g., Si and SiGe) having depth-dependent material etch rates and optionally including a bottom metal gate layer, a controlled gate sidewall profile is obtained in a device that can be used with the newer CMOS metal gate technologies. By providing depth-dependent material etch rates, the material at a given depth z has a different etch rate to the same etch environment. In the gate stack structure, the composition and positioning of the layers are selected by taking into account the predetermined sequence of patterning and etching steps so that a more idealized vertical gate sidewall profile may be obtained. In other words, the graded material composition of the gate stack structure may be selected to counteract a tendency of the predetermined sequence of patterning and etching steps to etch an irregular sidewall profile (e.g., a notched profile, an hour glass shaped profile or a profile with foot extensions) in the etched gate if the gate stack structure was formed from only polysilicon.

In another form, a method is provided for etching a gate electrode. In the method, a gate dielectric layer is formed over a substrate, an optional metallic layer is formed over the gate dielectric layer, and then a graded composition of silicon-based layers having depth-dependent material etch rates are formed over the gate dielectric layer/metallic layer. In a selected embodiment, the graded composition is formed by including a predetermined content of one or more of germanium or carbon at a predetermined depth in the graded composition of silicon-based layers, where the predetermined content and predetermined depth are selected by taking into account a predetermined sequence of patterning and etching steps subsequently used to etch the graded composition of silicon-based layers. As a result, when the etch is performed, an etched gate electrode is obtained having substantially vertical sidewalls. The material used to form the graded composition may be represented as $Si_{1-a-b-c} A_a B_b C_c$, where A may be a species suitable for forming an alloy with silicon, B may be an inert chemical species, C may be a dopant, and a, b, c are content parameters defined as a function of a gate electrode vertical coordinate z. Alternatively, the material used to form the graded composition may be represented as $Si_{1-x}Ge_x$, where x is a function of a gate stack vertical coordinates. By structuring the graded composition to take into account the etching tendencies of the predetermined sequence of gate patterning and etching steps, the gate sidewall may be controlled. For example, when the predetermined sequence of patterning and etching steps would etch a gate electrode with bottom notches from a single polysilicon layer, the graded composition is formed with a bottom layer of polysilicon and an upper layer of silicon germanium. Alternatively, when the predetermined sequence of patterning and etching steps would etch a gate electrode with bottom foot extensions from a single polysilicon layer, the graded composition is formed with a bottom layer of silicon germanium and an upper layer of polysilicon. In addition, when the predetermined sequence of patterning and etching steps would etch an hour glass shaped gate electrode from a single polysilicon layer, the graded composition is formed with a bottom layer of silicon germanium, a middle layer of polysilicon and an upper layer of silicon germanium.

In yet another form, a method is provided for forming gates in a semiconductor device. Under the method, a plurality of silicon-based gate stack layers are formed (e.g., by CVD) over a dielectric layer by including one or more additional species in at least a first silicon-based layer to alter an etch rate of said first silicon-based layer. The additional species are included at a predetermined content and depth that are determined by taking into account a predetermined sequence of patterning and etching steps subsequently used to etch the plurality of silicon-based gate stack layers to obtain an etched gate having substantially vertical sidewalls. In an example embodiment, germanium is used as the additional species in the first silicon-based layer to form silicon germanium in a middle region of the plurality of silicon-based gate stack layers. With the silicon germanium layer, an hour glass shaped profile is prevented from forming during the predetermined sequence of patterning and etching steps by reducing the etch rate of the middle region.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, comprising:
    providing a semiconductor substrate;
    forming a first insulating layer over the semiconductor substrate;
    forming a gate stack structure over the first insulating layer, said gate stack structure comprising a silicon-based layer having a graded composition of germanium that provides a depth-dependent material etch rate, where the graded composition is formed from a graded composite material $Si_{1-x}Ge_x$, where content x of the germanium relative to silicon is a function of a gate stack vertical dimension so as to be controlled to vary across the depth of the silicon-based layer to influence a local etch rate relative to another depth; and
    selectively etching the gate stack structure to form an etched gate having straight line vertical sidewalls.

2. The method of claim 1, further comprising forming a metal layer on the first insulating layer for inclusion in the subsequently formed gate stack structure.

3. The method of claim 1, where the gate stack structure comprises a bottom layer of polysilicon and an upper layer of silicon germanium.

4. The method of claim 1, where the gate stack structure comprises a bottom layer of silicon germanium and an upper layer of polysilicon.

5. The method of claim 1, where the gate stack structure comprises a bottom layer of silicon germanium, a middle layer of polysilicon and an upper layer of silicon germanium.

6. The method of claim 1, where the graded composition of the gate stack structure is selected to counteract a tendency of a predetermined sequence of patterning and etching steps to etch a notched sidewall profile in the etched gate if the gate stack structure was formed from only polysilicon.

7. The method of claim 1, where the graded composition of the gate stack structure is selected to counteract a tendency of the predetermined sequence of patterning and etching steps to etch an hour glass shaped sidewall profile in the etched gate if the gate stack structure was formed from only polysilicon.

8. The method of claim 1, where the graded composition of the gate stack structure is selected to counteract a tendency of a predetermined sequence of patterning and etching steps to etch a sidewall profile having a foot extension in the etched gate if the gate stack structure was formed from only polysilicon.

9. A method for etching a gate electrode, comprising:
    providing a substrate for forming a semiconductor device;
    forming a gate dielectric layer over the substrate;
    forming over the gate dielectric layer a graded composition of silicon-based layers comprising $Si_{1-a-b-c} A_a B_b C_c$, where A may be germanium or carbon, B may be an inert chemical species, C may be a dopant, and a, b, c are content parameters defined as a function of a gate electrode vertical coordinate z, such that the graded composition of silicon-based layers comprises a bottom layer of silicon germanium or silicon carbide, a middle layer of polysilicon and an upper layer of silicon germanium or silicon carbide having depth-dependent material etch rates, where the predetermined content of one or more of germanium or carbon is controlled at a predetermined depth in the graded composition of silicon-based layers to provide the depth-dependent material etch rate; and selectively etching the graded composition of silicon-based layers to obtain an etched gate electrode having substantially straight line vertical sidewalls.

10. The method of claim 9, further comprising forming a metallic layer over the gate dielectric layer before forming the graded composition of silicon-based layers.

11. A method of forming a gate in semiconductor device, comprising:

forming a plurality of silicon-based gate stack layers over a dielectric layer comprising a first silicon-based layer having a graded composition of germanium to provide depth dependent etch rates, where the first silicon-based layer having the graded composition is formed from a graded composite material $Si_{1-x}Ge_x$, where content x of the germanium relative to silicon is a function of a gate stack vertical coordinate to vary across the depth of the first silicon-based layer to control a local etch rate of the first silicon-based layer relative to another depth; and using a predetermined sequence of patterning and etching steps to etch the plurality of silicon-based gate stack layers to obtain an etched gate having substantially straight line vertical sidewalls.

12. The method of claim 11, where the first silicon-based layer forms a graded silicon germanium layer in a middle region of the plurality of silicon-based gate stack layers, thereby preventing formation of an hour glass shaped profile during the predetermined sequence of patterning and etching steps by reducing etching of the middle region.

* * * * *